(12) United States Patent
Sharma

(10) Patent No.: US 7,138,341 B1
(45) Date of Patent: Nov. 21, 2006

(54) PROCESS FOR MAKING A MEMORY STRUCTURE

(75) Inventor: Manish Sharma, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/886,963

(22) Filed: Jul. 7, 2004

(51) Int. Cl.
*H01L 21/302* (2006.01)
*H01L 21/461* (2006.01)

(52) U.S. Cl. .................. 438/739; 438/737; 438/713; 257/E21.033; 257/E21.035

(58) Field of Classification Search .......... 438/717, 438/739, 738, 945, 712, 713, 737; 257/E21.033, 257/E21.035, E21.036, E21.048
See application file for complete search history.

(56) References Cited

U.S. PATENT DOCUMENTS 5,529,952 A * 6/1996 Smith et al. ............ 438/380

OTHER PUBLICATIONS

Shoji et al., "All Refractory Josephson Tunnel Junctions Fabricated by Reactive Ion Etch," IEEE 1983, pp. 827-830.

* cited by examiner

*Primary Examiner*—Caridad Everhart

(57) ABSTRACT

An exemplary method for making a memory structure comprises forming a first hard mask layer, forming at least one mask layer above the first hard mask layer, patterning the at least one mask layer, etching the at least one mask layer to form an opening having a first lateral width, and a second lateral width different than the first lateral width, forming a second hard mask layer having substantially the first and second lateral widths in the opening, and etching the first hard mask layer using at least one of the lateral widths of the second hard mask layer.

18 Claims, 4 Drawing Sheets

PROCESS FOR MAKING A MEMORY STRUCTURE

BACKGROUND

A memory chip generally comprises a plurality of memory cells that are deposited onto a silicon wafer and addressed via an array of column conducting leads (bit lines) and row conducting leads (word lines). Typically, a memory cell is situated at the intersection of a bit line and a word line. The memory cells are controlled by specialized circuits that perform functions such as identifying rows and columns from which data are read or to which data are written. Typically, each memory cell stores data in the form of a "1" or a "0," representing a bit of data.

An array of magnetic memory cells can be referred to as a magnetic random access memory or MRAM. MRAM is generally nonvolatile memory (i.e., a solid state chip that retains data when power is turned off). At least one type of magnetic memory cell includes a data layer and a reference layer, separated from each other by at least one intermediate layer. The data layer may also be referred to as a bit layer, a storage layer, or a sense layer. A typical data layer might be made of one or more ferromagnetic materials. In a magnetic memory cell, a bit of data (e.g., a "1" or "0") may be stored by writing into the data layer via one or more conducting leads (e.g., a bit line and a word line). The write operation is typically accomplished via a write current that sets the orientation of the magnetic moment in the data layer to a predetermined direction.

Once written, the stored bit of data may be read by providing a read current through one or more conducting leads (e.g., a read line) to the magnetic memory cell. For each memory cell, the orientations of the magnetic moments of the data layer and the reference layer are either parallel (in the same direction) or anti-parallel (in different directions) to each other. The degree of parallelism affects the resistance of the cell, and this resistance can be determined by sensing (e.g., via a sense amplifier) an output current or voltage produced by the memory cell in response to the read current.

More specifically, if the magnetic moments are parallel, the resistance determined based on the output current is of a first relative value (e.g., relatively low). If the magnetic moments are anti-parallel, the resistance determined is of a second relative value (e.g., relatively high). The relative values of the two states (i.e., parallel and anti-parallel) are typically different enough to be sensed distinctly. A "1" or a "0" may be assigned to the respective relative resistance values depending on design specification.

The intermediate layer, which may also be referred to as a spacer layer, may comprise insulating material (e.g., dielectric), non-magnetic conducting material, and/or other known materials, and is usually thick enough to prevent exchange coupling between the data and reference layers. The various conducting leads which are used to address the memory cells (e.g., bit lines, word lines, and read lines), and to provide currents to pass through the data and reference layers to read data from or write data to the memory cells are provided by one or more additional layers, called conducting layer(s).

The layers described above and their respective characteristics are typical of magnetic memory cells based on tunneling magnetoresistance (TMR) effects known in the art. Other combinations of layers and characteristics may also be used to make magnetic memory cells based on TMR effects. See, for example, U.S. Pat. No. 6,404,674, issued to Anthony et al., which is hereby incorporated by reference in its entirety for all purposes.

Still other configurations of magnetic memory cells are based on other well known physical effects (e.g., giant magnetoresistance (GMR), anisotropic magnetoresistance (AMR), colossal magnetoresistance (CMR), and/or other physical effects).

Throughout this application, various exemplary embodiments will be described in reference to the TMR memory cells as first described above. Those skilled in the art will readily appreciate that the exemplary embodiments may also be implemented with other types of magnetic (or non-magnetic) memory cells known in the art (e.g., other types of TMR memory cells, GMR memory cells, AMR memory cells, CMR memory cells, etc.) according to the requirements of a particular implementation.

Generally speaking, desirable characteristics for any configuration of memory device include increased speed, reduced power consumption, and/or lower cost. A simpler fabrication process and/or a smaller chip size may achieve lower cost.

Thus, a market exists for a simplified process to make memory structures.

SUMMARY

An exemplary memory structure comprises a memory cell, at least one hard mask layer above the memory cell, the hard mask layer having a first lateral width, and a second lateral width different than the first lateral width, and a conductor above the at least one hard mask layer, wherein the conductor makes electrical contact with the memory cell via the at least one hard mask layer.

A method for making a memory structure comprises forming a memory cell layer, forming at least one hard mask layer above the memory cell layer, the at least one hard mask layer having a first lateral width and a second lateral width and the first lateral width being smaller than the second lateral width, and etching the memory cell layer using at least one of the lateral widths of the hard mask layer to form one or more memory cells.

Other embodiments and implementations are also described below.

DETAILED DESCRIPTION

I. Overview

Exemplary improved manufacturing processes for making magnetic memory structures are described herein.

Section II describes an exemplary magnetic memory structure.

Section III describes an exemplary improved process for making an exemplary memory structure of Section II.

II. An Exemplary Magnetic Memory Structure

Figure 1:
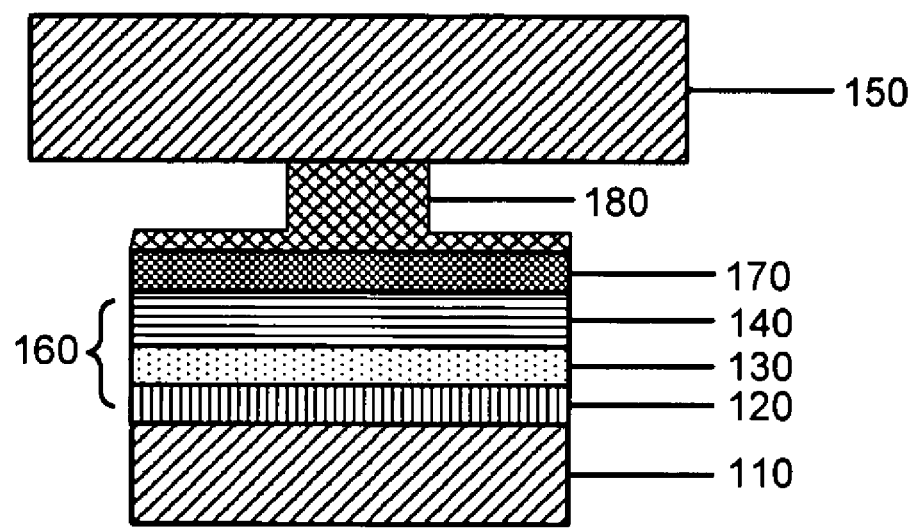
FIG. 1 illustrates an exemplary magnetic memory structure configuration.

FIG. 1 illustrates an exemplary magnetic memory structure 100 that may be manufactured by the improved process to be described in Section III below. Generally, a memory structure may be made as top-pinned (where the reference layer is formed above the data layer in terms of the sequence of deposition) or bottom-pinned (where the reference layer is below the data layer). For ease of explanation, only the top-pinned configuration is shown in FIG. 1 and referenced in the description of various exemplary embodiments herein. However, this configuration is merely illustrative. Thus, one skilled in the art will readily appreciate that other configurations (e.g., bottom-pinned, etc.) may also be implemented using the exemplary processes disclosed herein in accordance with any particular design requirement.

The exemplary memory structure 100 includes a first conductor 110, a data layer 120, a spacer layer 130, a reference layer 140, a first hard mask layer 170, a second hard mask layer 180, and a second conductor 150. For ease of explanation, the combination of the data layer 120, the spacer layer 130, and the reference layer 140 may also be referred to as a memory cell 160. Of course, the memory cell 160 may also be bottom-pinned (not shown), in which case the reference layer 140 is below the data layer 120.

One skilled in the art will recognize that the memory structure configuration as illustrated in FIG. 1 is merely illustrative. Other configurations, for example, configurations having additional conductors (e.g., separate conductors for read operations) and/or configurations having additional layers are also known in the prior art. For example, another magnetic memory structure configuration may also include a seed layer, an antiferromagnetic (AFM) layer, a protective cap layer, and/or other layers. The seed layer generally enhances crystalline alignment within the AFM layer. Exemplary materials for a seed layer include Ta, Ru, NiFe, Cu, or combinations of these materials. The AFM layer generally enhances magnetic stability in the reference layer 140. Exemplary materials for an AFM layer include IrMn, FeMn, NiMn, PtMn, and/or other well known materials. The protective cap layer protects the data layer 120 from the environment (e.g., by reducing oxidation of the data layer 120) and may be formed using any suitable material known in the art, for example, Ta, TaN, Cr, Al or Ti. For ease of explanation, these additional layers are not shown in the Figures; however, magnetic memory structures having one or more of these additional layers may be implemented with various embodiments to be described herein in accordance with a particular design choice.

The first and second conductors, 110 and 150, may be made of Cu, Al, AlCu, Ta, W, Au, Ag, alloys of one or more of the above, and/or other conducting materials and alloys known to those skilled in the art. The conductors may be formed by deposition or other techniques known in the art (e.g., sputtering, evaporation, electroplating, etc.).

The data layer 120 may comprise one or more ferromagnetic materials. In an exemplary embodiment, ferromagnetic materials suitable for the data layer 120 include, without limitation, NiFe, NiFeCo, CoFe, other magnetic alloys of NiFe and Co, amorphous ferromagnetic alloys, and still other materials known to those skilled in the art.

In an exemplary embodiment, the spacer layer 130 is a tunnel barrier layer (e.g., if the memory cell 100 is a TMR memory cell). In this embodiment, the spacer layer 130 may be made of $SiO_2$, $SiN_x$, MgO, $Al_2O_3$, $AlN_x$, $TaO_x$, and/or other insulating materials known to those skilled in the art.

In another exemplary embodiment, the spacer layer 130 is a non-magnetic conducting layer (e.g., if the memory cell 100 is a GMR memory cell). In this embodiment, the spacer layer 130 may be made of Cu, Au, Ag, and/or other non-magnetic conducting materials known to those skilled in the art.

The reference layer 140 may comprise a single layer of material or multiple layers of materials. For example, the reference layer 140 may comprise one or more ferromagnetic materials. In an exemplary embodiment, ferromagnetic materials suitable for the reference layer 140 include NiFe, NiFeCo, CoFe, other magnetic alloys of NiFe and Co, amorphous ferromagnetic alloys, and other materials known to those skilled in the art.

A hard mask layer typically comprises one or more materials that are relatively more difficult to etch away than organic photoresist. Exemplary hard mask materials include, without limitation, diamond-like carbon (DLC), amorphous carbon (a-C), TaN, SiC, $SiN_x$, $SiO_x$, and/or one or more metal layers (e.g., Cr, Ta, etc.). In an exemplary implementation, the first hard mask layer 170 may comprise TaN and the second hard mask layer 180 may comprise Cr. This application will also refer to one or more mask layers. A mask layer typically comprises, without limitation, organic photoresist and/or other materials that are relatively easier to etch away than a hard mask layer.

In the exemplary configuration illustrated in FIG. 1, the first conductor 110 and the second conductor 150 are orthogonal to each other and are collectively used for both write and read operations.

One skilled in the art will recognize that the memory structure configuration as illustrate in FIG. 1 is merely illustrative. Other configurations, for example, a smaller data layer relative to the reference layer, a differently shaped data and/or reference layer, a bottom-pinned configuration, etc., may also be implemented. Further, configurations having additional conductor(s) (e.g., separate conductors for read operations) and/or configurations having additional layers can also be implemented in accordance with specific design choices.

Generally, the physical configurations of magnetic memory structures, such as the one shown in FIG. 1, are very complex, and thus may require complex fabrication steps. For example, the small dimensions and multiple layers of conventional magnetic memory structures require precise, and numerous, masking steps with an associated risk of having some shorted memory cells. For example, making an electrical connection between conductor 150 and the reference layer 140 has typically been challenging because any spillage of the conducting material onto the data layer 120 can cause a short circuit and render the affected magnetic memory cell(s) useless. An exemplary process for making an electrical connection between conductor 150 and the reference layer 140 is known in the art as the "self-aligned via" process. The self-aligned via process generally uses a first mask layer and a second mask layer to create mushroom-like structures (e.g., a patterned second mask layer on top of a smaller patterned first mask layer) to enable the reference layer 140 to be electrically isolated from the conductor 150 by a dielectric layer formed around the mushroom-like strucutres. See, for example, Shoji et al, "*All Refractory Josephson Tunnel Junctions Fabricated by Reactive Ion Etching*," I.E.E.E., 1983, pages 827–830.

As the dimensions of magnetic memory structures (e.g., magnetic memory cells) become smaller, the self-aligned via process may fail to create the mushroom-like structures. As the memory cell becomes smaller, the lateral width of a first mask layer will also be proportionally reduced. In addition, the thicknesses of first and second mask layers may not be reduced proportionally, thus, potentially resulting in an undesirable aspect ratio between the layers. Consequently, a patterned second mask layer on top of a first mask layer may become unstable and topple over.

An improved process for making small memory structures is described in Section III below. The improved process described in Section III enables a second conductor 150 to effectively make electrical contact with a magnetic memory cell 160. However, the improved process is merely exemplary. One skilled in the art will recognize that the improved process as described herein is widely applicable to other memory structures in any magnetic or non-magnetic memory device.

III. An Exemplary Improved Process for Making Exemplary Magnetic Memory Structures FIGS. 2A–2J illustrate an exemplary improved process for making the exemplary memory structure of FIG. 1.

Figure 2A:
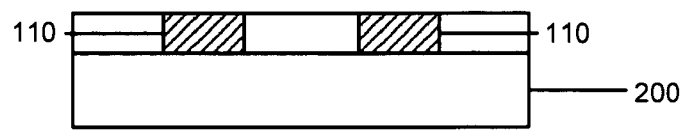
FIGS. 2A–2J illustrate an exemplary process for making the exemplary magnetic memory structure of FIG. 1.

In FIG. 2A, a first conductor 110 is formed on a substrate 200. The first conductor 110 is formed in accordance with methods known in the art. For example, the first conductor 110 may be formed using electroplating, sputtering or other suitable deposition process then planarized by a process such as chemical mechanical planarization (CMP).

Figure 2B:
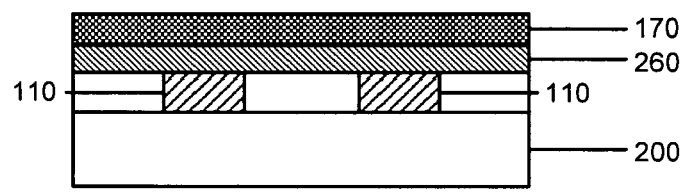

In FIG. 2B, one or more memory cell layers 260 and a first hard mask layer 170 are formed. For ease of explanation, a single memory cell layer 260 is deposited. However, one skilled in the art will appreciate that multiple layers can be present. For example, the depicted memory cell layer 260 may actually comprise a data layer, a spacer layer, and a reference layer, such as layers 120–140 shown in FIG. 1. These layers may be formed by deposition and/or other techniques known in the art (e.g., via sputtering, evaporation, chemical vapor deposition, atomic layer deposition (ALD), and/or other known techniques).

Figure 2C:
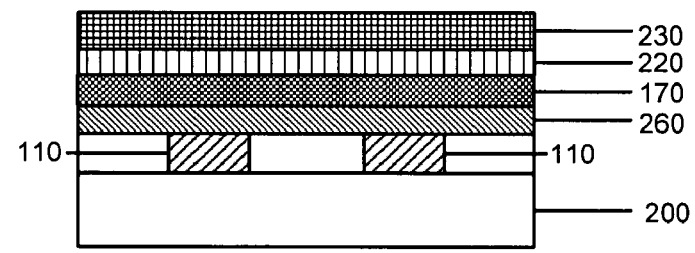

In FIG. 2C, first and second mask layers, 220 and 230 are formed. In an exemplary implementation, the first and second mask layers comprise photoresist materials having different organic compositions relative to each other. These layers may be formed by spinning and baking processes, and/or other processes known in the art.

Figure 2D:
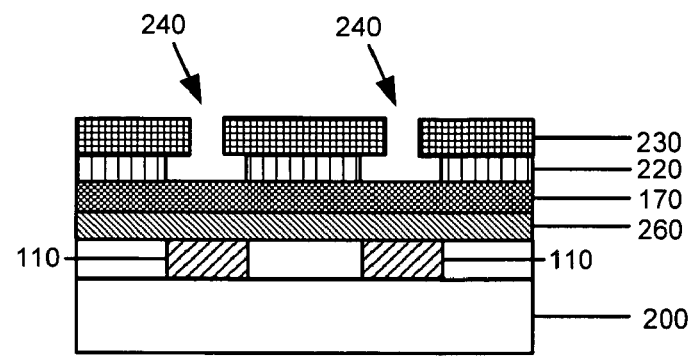

In FIG. 2D, the second mask layer 230 is patterned and etched using photolithographic techniques known in the art to form openings 240 having a first lateral width. In an exemplary implementation, the first lateral width is smaller than the lateral width of a memory cell. Next, the first mask layer 220 is etched by reactive ion etch (RIE), chemical etching, or other known etching techniques to create undercuts in the openings 240 underneath the patterned second mask layer 230. In an exemplary implementation, the first mask layer 220 is etched so that the bottoms of the openings 240 have a second lateral width different than the first lateral width. In an exemplary implementation, the second lateral width is approximately equal to the lateral width of a memory cell (to be formed). This can be achieved by selective chemical or physical etching techniques known in the art.

Figure 2E:
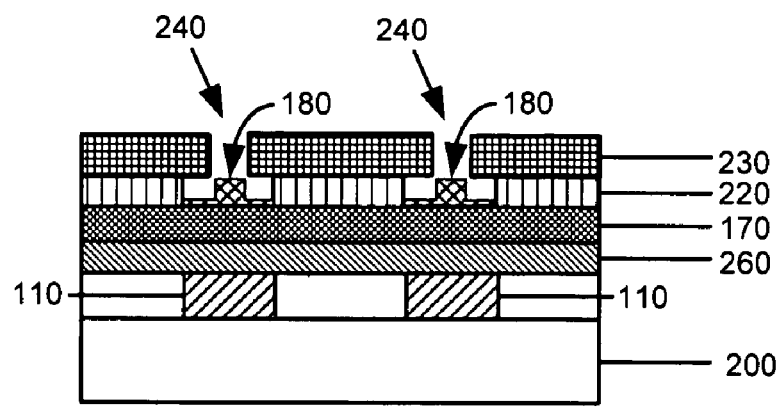

In FIG. 2E, a second hard mask layer 180 is formed in the openings 240. In an exemplary implementation, the second hard mask layer 180 is formed by performing a directional deposition, such as ion-beam evaporation, molecular beam epitaxy, or other directional deposition techniques known or later developed in the art. When implementing a directional deposition, typically, the majority of the material to be deposited will form approximately in the middle of an opening 240. The formation in the middle will generally have approximately the same lateral width as the first lateral width. In addition, a thin layer of material will typically coat the remaining space on the bottoms (and sidewalls) of the openings 240. The thin layer on the bottoms will have approximately the same lateral width as the second lateral width.

In another exemplary implementation, depending on design choice, a less-directional deposition may be implemented, either in combination with or instead of a more directional deposition. Examples of such deposition techniques include, without limitation, sputtering, laser ablation, and ion-beam deposition. These techniques may either be non-directional, or weakly directional, depending on the specific characteristic of a particular implementation. In an exemplary implementation, a less-directional deposition technique may be implemented first to form a layer of the second hard mask material having approximately the second lateral width at the bottoms of openings 240, and then a directional deposition technique may be implemented to form another layer of the second hard mask material having approximately the first lateral width in the middle of the openings 240. This combination of techniques may be desirable to control the thickness of the layer of materials forming at the bottoms of the openings 240. Depending on other downstream processing steps or design choice, a thicker layer at the bottoms of the openings 240 may be useful.

Figure 2F:
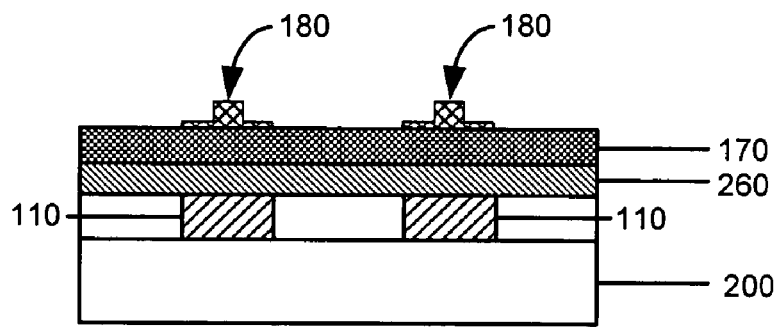

In FIG. 2F, the first the second mask layers 220, 230 are removed by etching techniques known in the art, such as chemical wet etching, RIE, etc.

Figure 2G:
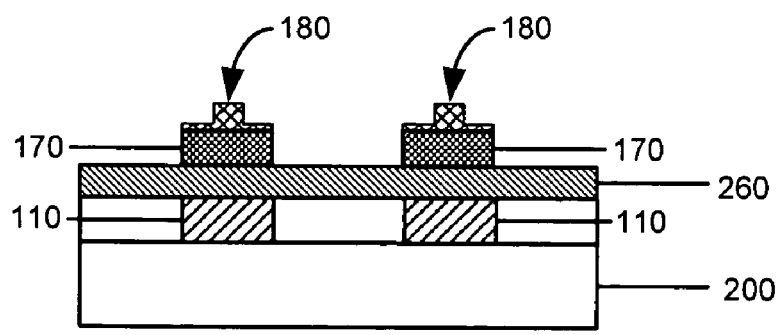

In FIG. 2G, the second lateral width of the second hard mask layer 180 is used as a mask for etching the first hard mask layer 170 using etching techniques known in the art (e.g., RIE).

Figure 2H:
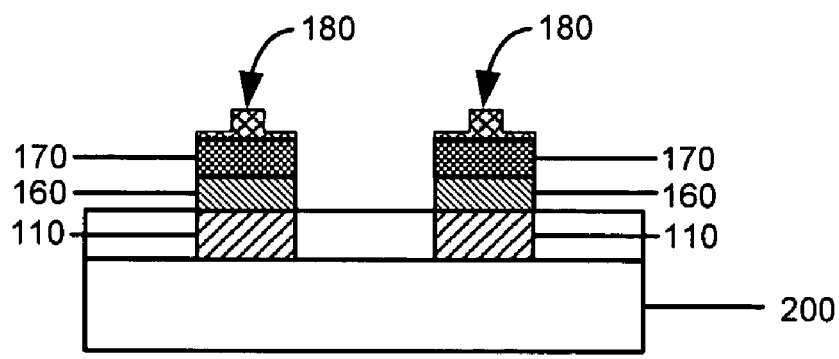

In FIG. 2H, the etched first hard mask layer 170 can be used as a mask to etch the memory cell material 260 using etching techniques known in the art (e.g., RIE, physical milling, etc.) to form memory cells 160. Alternatively, or in combination, the second lateral width of the second hard mask layer 180 may also be used as a mask to etch the memory cell material 260. The memory cell material 260 may or may not be etched in the same processing step as the step for etching the first hard mask layer 170. For example, physical milling may be performed to etch both the first hard mask layer 170 and the memory cell material 260.

Figure 2I:
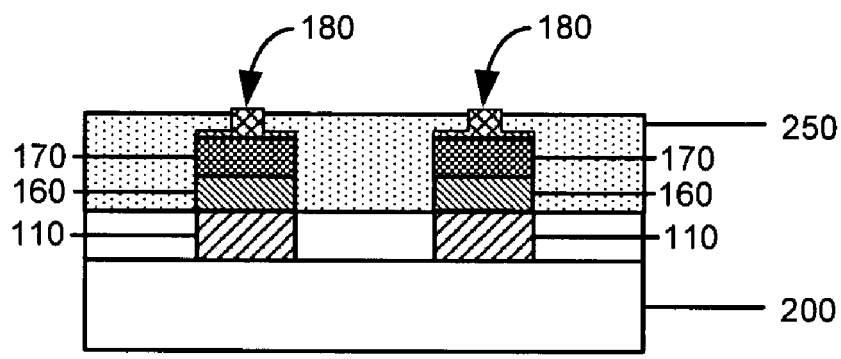

In FIG. 2I, a layer of dielectric material 250 is formed to cover substantially all structures then planarized until some of the second hard mask layer 180 is exposed. The dielectric material 250 can be formed using any deposition technique known in the art. The deposited dielectric layer may be planarized by known techniques such as CMP. In an exemplary implementation, the planarization process may be calibrated to stop when the top of the second hard mask layer 180 (having approximately the first lateral width) appears.

Figure 2J:
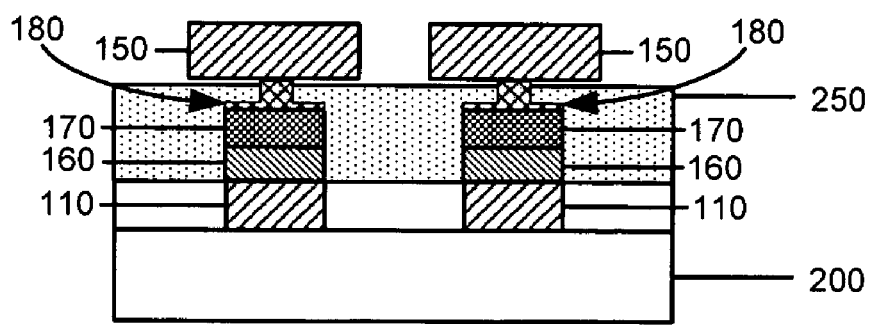

In FIG. 2J, a second conductor 150 is formed by deposition and patterning techniques known in the art.

The manufacturing steps illustrated above are merely exemplary. Those skilled in the art will appreciate that other manufacturing steps may be used in accordance with the requirements of a particular implementation. For example, the various layers as illustrated in FIGS. 2A–2J may be formed in accordance with other manufacturing sequences, one or more layers may be formed or etched at the same time, one or more layers of different materials may be combined to form a single layer, etc.

Further, the TMR memory cell illustrated above is merely exemplary. Those skilled in the art will appreciate that other types of memory cells (e.g., GMR memory cells, non-magnetic memory cells, etc.) may be constructed according to the requirements of a particular implementation.

IV. Conclusion

The foregoing examples illustrate certain exemplary embodiments from which other embodiments, variations, and modifications will be apparent to those skilled in the art. The inventions should therefore not be limited to the particular embodiments discussed above, but rather are defined by the claims. Furthermore, some of the claims may include alphanumeric identifiers to distinguish the elements and/or recite elements in a particular sequence. Such identifiers or sequence are merely provided for convenience in reading, and should not necessarily be construed as requiring or implying a particular order of steps, or a particular sequential relationship among the claim elements.

What is claimed is:

1. A method for making a memory structure, comprising:
   forming a first hard mask layer;
   forming at least one mask layer above said first hard mask layer;
   patterning said at least one mask layer;
   etching said at least one mask layer to form an opening having a first lateral width and a second lateral width having a different width than said first lateral width;
   forming a second hard mask layer in said opening, said second hard mask layer having substantially said first and second lateral widths; and
   etching said first hard mask layer using at least one of said lateral widths of said second hard mask layer wherein said first hard mask layer is formed above a memory cell material and said memory cell material is etched using said etched first hard mask layer to form one or more memory cells.

2. The method of claim 1, wherein a conducting layer is formed on said second hard mask layer to make electrical contact to said memory cells.

3. The method of claim 1, wherein said memory cell material includes a data layer, a spacer layer, and a reference layer.

4. The method of claim 1, wherein at least one of said hard mask layers includes a metal.

5. The method of claim 1, wherein said at least one mask layer includes a photoresist material.

6. A method for making a memory structure, comprising:
   forming a first hard mask layer;
   forming at least one mask layer above said first hard mask layer;
   patterning said at least one mask layer;
   etching said at least one mask layer to form an opening having a first lateral width and a second lateral width having a different width than said first lateral width;
   forming a second hard mask layer in said opening, said second hard mask layer having substantially said first and second lateral widths; and
   etching said first hard mask layer using at least one of said lateral widths of said second hard mask layer wherein said at least one mask layer includes a first mask layer and a second mask layer; and etching said second mask layer to form a patterned second mask layer wherein said etching said second mask layer includes etching until said opening having said first lateral width is achieved.

7. The method of claim 6, wherein said first lateral width is smaller than a lateral width of a memory cell.

8. A method for making a memory structure, comprising:
   forming a first hard mask layer;
   forming at least one mask layer above said first hard mask layer;
   patterning said at least one mask layer;
   etching said at least one mask layer to form an opening having a first lateral width and a second lateral width having a different width than said first lateral width;
   forming a second hard mask layer in said opening, said second hard mask layer having substantially said first and second lateral widths; and
   etching said first hard mask layer using at least one of said lateral widths of said second bard mask layer
   wherein said at least one mask layer includes a first mask layer and a second mask layer and wherein said patterning said at least one mask layer comprises etching at least said first mask layer until an undercut appears below said second mask layer.

9. The method of claim 8, wherein said etching said first mask layer includes etching in a chemical solvent that preferentially etches said first mask layer relative to said second layer.

10. The method of claim 8, wherein said etching said first mask layer includes etching until said second lateral width is achieved in said first mask layer.

11. The method of claim 10, wherein said second lateral width is approximately equal to a lateral width of a memory cell.

12. A method for making a memory structure, comprising:
    forming a first hard mask layer;
    forming at least one mask layer above said first hard mask layer;
    patterning said at least one mask layer;
    etching said at least one mask layer to form an opening having a first lateral width and a second lateral width having a different width than said first lateral width;
    forming a second hard mask layer in said opening, said second hard mask layer having substantially said first and second lateral widths;
    etching said first hard mask layer using at least one of said lateral widths of said second hard mask layer; and
    wherein said forming a second hard mask layer includes implementing a directional deposition technique including molecular beam epitaxy.

13. A method for making a memory structure, comprising:
    forming a first hard mask layer;
    forming at least one mask layer above said first hard mask layer;
    patterning said at least one mask layer;
    etching said at least one mask layer to form an opening having a first lateral width and a second lateral width having a different width than said first lateral width;
    forming a second hard mask layer in said opening, said second hard mask layer having substantially said first and second lateral widths, wherein said forming a second hard mask layer includes implementing a less-directional deposition technique including sputtering; and
    etching said first hard mask layer using at least one of said lateral widths of said second hard mask layer.

14. A method for making a memory structure, comprising:
    forming a first hard mask layer;
    forming at least one mask layer above said first hard mask layer;
    patterning said at least one mask layer;
    etching said at least one mask layer to form an opening having a first lateral width and a second lateral width having a different width than said first lateral width;
    forming a second hard mask layer in said opening, said second hard mask layer having substantially said first and second lateral widths; and etching said first hard mask layer using at least one of said lateral widths of said second hard mask layer wherein said etching said first hard mask layer includes using one of a reactive ion etch or a physical milling technique.

15. A method for making a memory structure comprising a plurality of memory cells, said method comprising:
forming a memory cell layer;
forming at least one hard mask layer above said memory cell layer, said at least one hard mask layer:
having a first lateral width and a second lateral width;
said first lateral width being smaller than said second lateral width;
etching said memory cell layer using at least one of said lateral widths of said hard mask layer to form one or more memory cells.

16. The method of claim 15, wherein said memory cell layer includes a data layer, a spacer layer, and a reference layer.

17. The method of claim 15, wherein said at least one hard mask layer includes a metal.

18. The method of claim 15, wherein said first lateral width is smaller than a lateral width of said one or more memory cells.

* * * * *